(12) United States Patent
Briggs et al.

(10) Patent No.: US 10,083,905 B2
(45) Date of Patent: Sep. 25, 2018

(54) SKIP-VIAS BYPASSING A METALLIZATION LEVEL AT MINIMUM PITCH

(71) Applicant: INTERNATIONAL BUSINESS MACHINES CORPORATION, Armonk, NY (US)

(72) Inventors: Benjamin D. Briggs, Waterford, NY (US); Lawrence A. Clevenger, LaGrangeville, NY (US); Bartlet H. DeProspo, Goshen, NY (US); Huai Huang, Clifton Park, NY (US); Christopher J. Penny, Saratoga Springs, NY (US); Michael Rizzolo, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/426,679

(22) Filed: Feb. 7, 2017

(65) Prior Publication Data

US 2018/0114752 A1  Apr. 26, 2018

Related U.S. Application Data

(62) Division of application No. 15/334,946, filed on Oct. 26, 2016, now Pat. No. 9,911,651.

(51) Int. Cl.
| H01L 29/06 | (2006.01) |
| H01L 23/522 | (2006.01) |
| H01L 23/528 | (2006.01) |
| H01L 23/532 | (2006.01) |
| H01L 21/768 | (2006.01) |

(52) U.S. Cl.
CPC .... *H01L 23/5226* (2013.01); *H01L 21/76831* (2013.01); *H01L 21/76843* (2013.01); *H01L 21/76871* (2013.01); *H01L 23/528* (2013.01); *H01L 23/5329* (2013.01); *H01L 23/53238* (2013.01)

(58) Field of Classification Search
CPC ......... H01L 21/32135; H01L 21/76816; H01L 21/76831; H01L 23/5226; H01L 23/5283; H01L 23/53209
USPC ................................ 257/397, 510, 513, 622
See application file for complete search history.

(56) References Cited

U.S. PATENT DOCUMENTS

| 4,767,724 A | 8/1988 | Kim et al. |
| 5,206,187 A | 4/1993 | Doan et al. |
| 6,015,751 A | 1/2000 | Liu |

(Continued)

OTHER PUBLICATIONS

List of IBM Patents or Patent Applications Treated as Related dated Feb. 7, 2017, 2 pages.

(Continued)

*Primary Examiner* — Tan N Tran
(74) *Attorney, Agent, or Firm* — Tutunjian & Bitetto, P.C.; Vazken Alexanian

(57) ABSTRACT

A method of forming a skip-via, including, forming a first dielectric layer on a first metallization layer, forming a second metallization layer on the first dielectric layer and a second dielectric layer on the second metallization layer, removing a section of the second dielectric layer to form a via to the second metallization layer, removing a portion of the second metallization layer to form an aperture, and removing an additional portion of the second metallization layer to form an exclusion zone.

19 Claims, 10 Drawing Sheets

(56) References Cited

U.S. PATENT DOCUMENTS

| | | | |
|---|---|---|---|
| 6,017,815 A | 1/2000 | Wu | |
| 6,143,640 A | 11/2000 | Cronin et al. | |
| 6,413,852 B1 | 7/2002 | Grill et al. | |
| 7,829,428 B1 | 11/2010 | Leng et al. | |
| 9,406,080 B2 * | 8/2016 | Tang | G06F 17/30864 |
| 2005/0189653 A1 * | 9/2005 | Tao | H01L 21/76804 |
| | | | 257/758 |
| 2006/0014376 A1 | 1/2006 | Agarwala et al. | |
| 2007/0216030 A1 * | 9/2007 | Schindler | H01L 21/76838 |
| | | | 257/763 |
| 2011/0204482 A1 | 8/2011 | Dirnecker et al. | |
| 2013/0234336 A1 | 9/2013 | Richter et al. | |
| 2013/0334659 A1 | 12/2013 | Liu et al. | |

OTHER PUBLICATIONS

Anonymous, "BEOL Deep Via Barrier Electrical Fuse", IP.com Prior Art Database Technical Disclosure. IP.com No. 000227939. IP.com Electronic Publication Date: May 29, 2013. pp. 1-4.

* cited by examiner

US 10,083,905 B2

SKIP-VIAS BYPASSING A METALLIZATION LEVEL AT MINIMUM PITCH

BACKGROUND

Technical Field

The present invention generally relates to the fabrication of a via that connects two metallization layers separated by an intervening metallization layer, and more particularly to forming a self-aligned skip-via through an intervening metallization layer implementing a reduced-sized exclusion zone.

Description of the Related Art

In fabricating semiconductor devices, multiple electrical connections are typically formed to each device, and tens, hundreds, thousands, and even millions of devices can be on a substrate. Openings filled with a conductive material are typically formed to connect the device connections to higher device levels for eventual connection to the electrical package contacts. With shrinking device sizes, the pitches between these electrical vias have also been shrinking.

Vias can typically be formed through dielectric layers, for example, interlayer dielectrics, to metallized layers and to components of the actual devices. The electrical connections between devices on the substrate and from the package contacts to the devices can be routed through the different metallized layers, which can act as wiring (e.g., channels). The multiple levels of interconnecting wiring are typically separated by the intervening dielectric layers through which the vias are formed. In typical integrated circuit packages seven or more metallization levels could be involved. The layout of the electrical connections can therefore be incredibly complex. Multiple patterning techniques involving registered mask patterns can be used to form the different levels. Multiple cycles of masking and etching may be used. This is typically considered the back-end-of-line (BEOL) fabrication stage.

With ever decreasing device dimensions, forming the individual components and electrical contacts becomes more difficult. An approach is therefore needed that retains the positive aspects of traditional FET structures, while overcoming the scaling issues created by forming smaller device components and the interconnects.

SUMMARY

In accordance with an embodiment of the present invention, a method of forming a skip-via is provided. The method includes forming a first dielectric layer on a first metallization layer. The method further includes forming a second metallization layer on the first dielectric layer and a second dielectric layer on the second metallization layer. The method further includes removing a section of the second dielectric layer to form a via to the second metallization layer. The method further includes removing a portion of the second metallization layer to form an aperture. The method further includes removing an additional portion of the second metallization layer to form an exclusion zone.

In accordance with another embodiment of the present invention, a method of forming a skip-via is provided. The method includes forming a first dielectric layer on a first metallization layer. The method further includes forming a second metallization layer on the first dielectric layer and a second dielectric layer on the second metallization layer. The method further includes forming a patterning layer on the second dielectric layer overlying the second metallization layer. The method further includes removing a portion of the patterning layer to expose a section of the second dielectric layer. The method further includes removing the exposed section of the second dielectric layer to form a via to the second metallization layer, wherein the second metallization layer overlies the first dielectric layer and the first metallization layer. The method further includes extending the via through the second metallization layer to form an aperture having a diameter, $d_a$, or width, $w_a$, in the range of about 12 nm to about 20 nm. The method further includes forming an exclusion zone within the second metallization layer by selectively widening the via by a lateral distance, b, relative to the diameter, $d_a$, or width, $w_a$, of the aperture.

In accordance with yet another embodiment of the present invention, a back-end-of-line interconnect structure having a skip-via is provided. The back-end-of-line interconnect structure includes a first metallization layer on a substrate. The back-end-of-line interconnect structure includes a first dielectric layer on the first metallization layer. The back-end-of-line interconnect structure includes a second metallization layer on the first dielectric layer. The back-end-of-line interconnect structure includes a second dielectric layer on the second metallization layer. The back-end-of-line interconnect structure includes a skip-via extending through the second dielectric layer, second metallization layer, and first dielectric layer to the first metallization layer. The back-end-of-line interconnect structure includes a dielectric collar in the second metallization layer around the skip-via to form an exclusion zone, wherein the dielectric collar has a width, $W_{dc}$, or diameter, $D_{dc}$, in the range of about 25 nm to about 39 nm.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Figure 1:
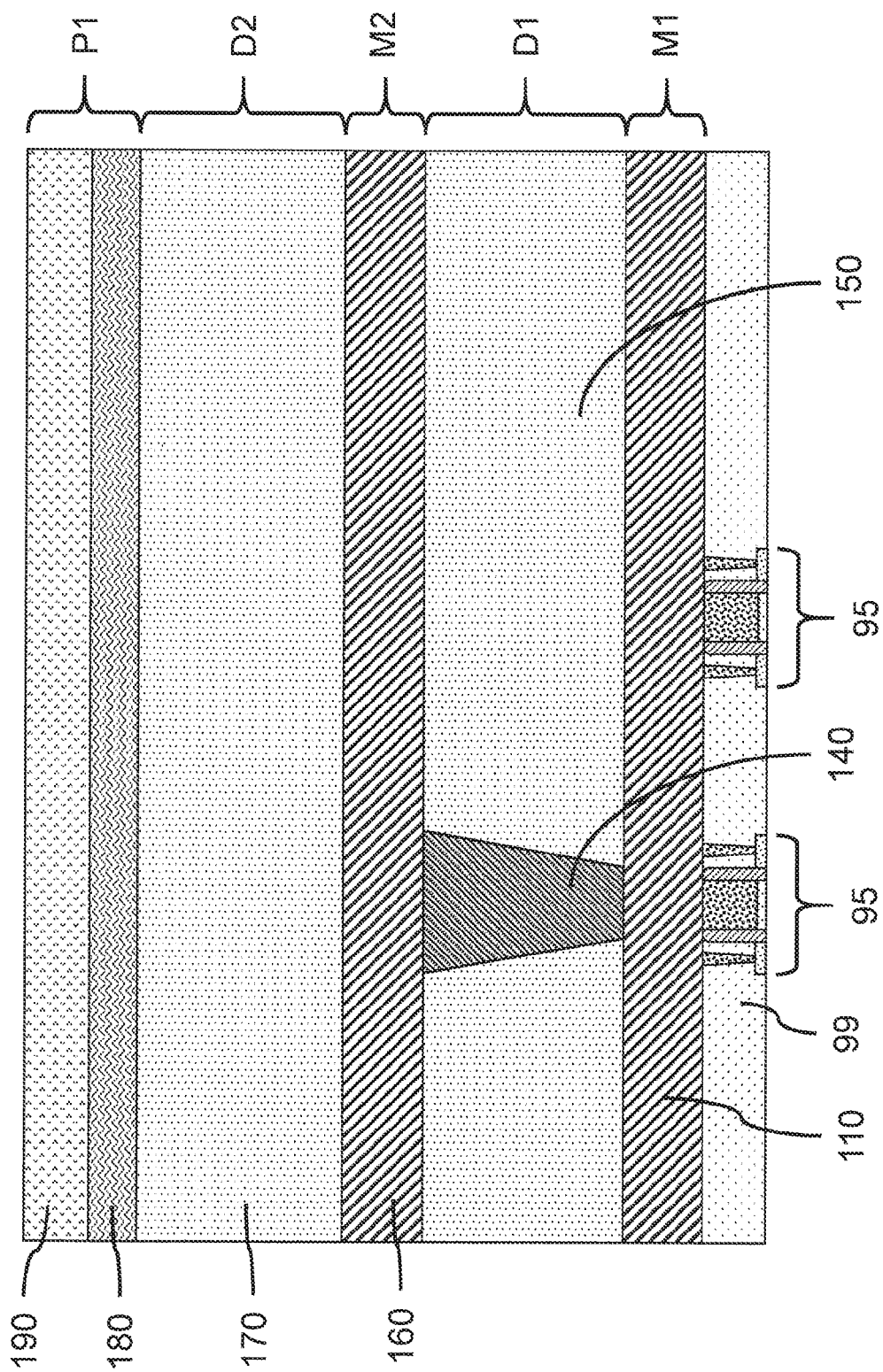
FIG. 1 is a cross-sectional side view of a multi-level metallization scheme with intervening interlayer dielectric layers, in accordance with an embodiment of the present invention.

Principles and embodiments of the present invention relate to fabricating one or more via openings and metal connections that interconnect two metallization levels that are separated by at least one other metallization level. The interconnecting via, referred to as a skip-via, can be electrically isolated from the intervening metallization level by an insulating exclusion zone. A self-aligned skip-via, for example, can connect metallization layer, M1, to metallization layer, M3, without any M2 patterning.

Principles and embodiments of the present invention also relate to forming a two-level via that involves a reduced lateral spacing of an exclusion zone at an intervening metallization level. Using a self-aligned skip-via can eliminate the need for patterning exclusion zones in the intervening metallization level (e.g., M2). Self-alignment can minimize the amount of wiring tracks that are lost in areas surrounding the skip-via location as well as reducing the risk for shorting between the skip-via and the intervening metal level.

Principles and embodiments of the present invention also relate to avoiding masking registration problems by providing a self-aligned via process that allows reduced-sized exclusion zones in the metallized levels for the vias.

Exemplary applications/uses to which the present invention can be applied include, but are not limited to: transistors for complementary metal-oxide-semiconductor (CMOS) devices, logic devices (e.g., NAND gates, NOR gates, XOR gates, etc.), memory devices (e.g., DRAM, SRAM, flip-flops, etc.), and complex (e.g., VLSI, ULSI, etc.) application specific integrated circuits (ASICS) and processors.

In various embodiments, the materials and layers can be deposited by physical vapor deposition (PVD), chemical vapor deposition (CVD), atomic layer deposition (ALD), molecular beam epitaxy (MBE), or any of the various modifications thereof, for example, plasma-enhanced chemical vapor deposition (PECVD), metal-organic chemical vapor deposition (MOCVD), low pressure chemical vapor deposition (LPCVD), electron-beam physical vapor deposition (EB-PVD), and plasma-enhanced atomic layer deposition (PEALD). The depositions can be epitaxial processes, and the deposited material can be crystalline. In various embodiments, formation of a layer may be by one or more deposition processes, where, for example, a conformal layer can be formed by a first process (e.g., ALD, PEALD, etc.) and a fill can be formed by a second process (e.g., CVD, electrodeposition, PVD, etc.).

It is to be understood that the present invention will be described in terms of a given illustrative architecture; however, other architectures, structures, substrate materials and process features and steps may be varied within the scope of the present invention.

It should be noted that certain features may not be shown in all figures for the sake of clarity. This is not intended to be interpreted as a limitation of any particular embodiment, or illustration, or scope of the claims.

Referring now to the drawings in which like numerals represent the same or similar elements and initially to FIG. 1, a multi-level metallization scheme with intervening interlayer dielectric layers is shown, in accordance with an embodiment of the present invention.

In one or more embodiments, a first metallization layer, M1, 110 can be formed on a plurality of fabricated semiconductor devices 95 on a substrate 99, where the plurality of active and passive devices 95, including semiconductor devices, (e.g., transistors, diodes, capacitors, resistors, etc.) were fabricated by front end of line (FEOL) processes. The first metallization layer 110 can connect a power line to device contacts and local interconnects to neighboring devices to form an intended circuit.

In various embodiments, the substrate 99 can be crystalline, semi-crystalline, microcrystalline, or amorphous. The substrate 99 can be essentially (i.e., except for contaminants) a single element (e.g., silicon), primarily (i.e., with doping) of a single element, for example, silicon (Si) or germanium (Ge), or the substrate can include a compound, for example, $Al_2O_3$, $SiO_2$, GaAs, SiC, or SiGe.

In one or more embodiments, the substrate 99 can have multiple material layers, for example, a semiconductor-on-insulator substrate (SeOI), a silicon-on-insulator substrate (SOI), germanium-on-insulator substrate (GeOI), or silicon-germanium-on-insulator substrate (SGOI), where an active surface semiconductor layer of the substrate 99 can be on a substrate insulator layer (e.g., buried oxide layer (BOX)). The substrate 99 can also have other layers forming the substrate, including high-k oxides and/or nitrides.

In one or more embodiments, a substrate insulator layer (e.g., BOX layer) can be formed on at least a portion of a substrate 99. A semiconductor active surface layer (ASL) can be on the BOX layer. The active surface layer can be on the buried oxide (BOX) layer that can physically separate and electrically insulate the active layer from a mechanically supporting portion of the substrate 99.

In various embodiments, the substrate 99 may be a single crystal silicon (Si), silicon germanium (SiGe), or III-V semiconductor (e.g., GaAs) wafer, or have a single crystal silicon (Si), silicon germanium (SiGe), or III-V semiconductor (e.g., GaAs) active surface layer. In one or more embodiments, the substrate 99 can be a silicon wafer.

In one or more embodiments, one or more active or passive devices, for example, transistors, resistors, capacitors, junction diodes, and inductors, may be formed on a substrate 99, where the one or more active or passive devices can be formed through front end-of-line processes, where the actual device layers and components can be fabricated by processes known in the art. The active devices can be semiconductor devices formed on and/or in the substrate 99.

In one or more embodiments, a first metallization layer, M1, 110 can be formed on the substrate 99, where the a first metallization layer can include a plurality of channels and contacts to the underlying device layers and components. The first metallization layer, M1, can include, for example, tungsten source, drain, and gate contacts formed in an interlayer dielectric to a device 95.

In one or more embodiments, a first dielectric layer, D1, 150 can be formed on the first metallization layer, M1, 110, where the first dielectric layer 150 can insulate the first metallization layer, M1, from a second metallization layer, M2, 160.

In various embodiments, a D1 level via 140 can be formed in the intervening first dielectric layer, D1, 150 from the second metallization layer, M2, 160 to the first metallization layer, M1, 110. The D1 level via 140 can be filled with a metal conductor, for example, tungsten, to provide an electrical connection to channels in the first metallization layer 110 or a device 95.

The first metallization layer, M1, first dielectric layer, D1, second metallization layer, M2, and second dielectric layer, D2, can form a back-end-of-line interconnect structure, where a conductive material filled via can electrically interconnect two different metallization layers through a dielectric layer.

In various embodiments, the first and second dielectric layers 150, 170 can be interlayer dielectric layers (ILDs), which can be silicon oxide (SiO) or a low-k dielectric, where the ILD can be formed by CVD, LPCVD, or spun on. In various embodiments, a low-k dielectric material can be a fluoride-doped silicon oxide (e.g., fluoride doped glass), a carbon-doped silicon oxide, a porous silicon oxide, a spin-on silicon based polymeric material (e.g., tetraethyl orthosilicatehydrogen (TEOS), hydrogen silsesquioxane (HSQ) and methyl silsesquioxane (MSQ)), or combinations thereof.

In one or more embodiments, a hardmask layer 180 can be formed on the second dielectric layer, D2, 170.

In one or more embodiments, the hardmask layer 180 can be silicon oxide (SiO), silicon nitride (SiN), a silicon oxynitride (SiON), a silicon carbonitride (SiCN), a silicon boronitride (SiBN), a silicon borocarbide (SiBC), a silicon boro carbonitride (SiBCN), a boron carbide (BC), a boron nitride (BN), or combinations thereof.

In one or more embodiments, a cover layer 190 can be formed on the hardmask layer 180 to form a patterning layer, P1.

In one or more embodiments, the cover layer 190 can be a metal nitride, including but not limited to, titanium nitride (TiN), hafnium nitride (HfN), zirconium nitride (ZrN), vanadium nitride (VN), niobium nitride (NbN), tantalum nitride (TaN), chromium nitride (CrN), molybdenum nitride (MoN), tungsten nitride (WN), or combinations thereof.

In various embodiments, the combination of materials for the cover layer 190, hardmask layer 180, and second dielectric layer 170 can be selected such that each layer can be selectively removed relative to the other layers. The hardmask layer 180 can act as an etch stop for forming an opening in the cover layer 190.

In a non-limiting exemplary embodiment, the cover layer 190 can be titanium nitride (TiN), the hardmask layer 180 can be silicon dioxide ($SiO_2$), and the second dielectric layer, D2, 170 can be a low-K dielectric insulating material, where the low-K dielectric insulating material can be a fluoride-doped silicon oxide (e.g., fluoride doped glass), a carbon-doped silicon oxide, a porous silicon oxide, a spin-on silicon based polymeric material (e.g., tetraethyl orthosilicatehydrogen (TEOS), silsesquioxane (HSQ) and methylsilsesquioxane (MSQ)), or combinations thereof. A low-k insulator material can have a dielectric constant of less than 3.9. The TiN can be selectively removed in relation to the underlying silicon dioxide and low-K dielectric insulating material.

Figure 2:
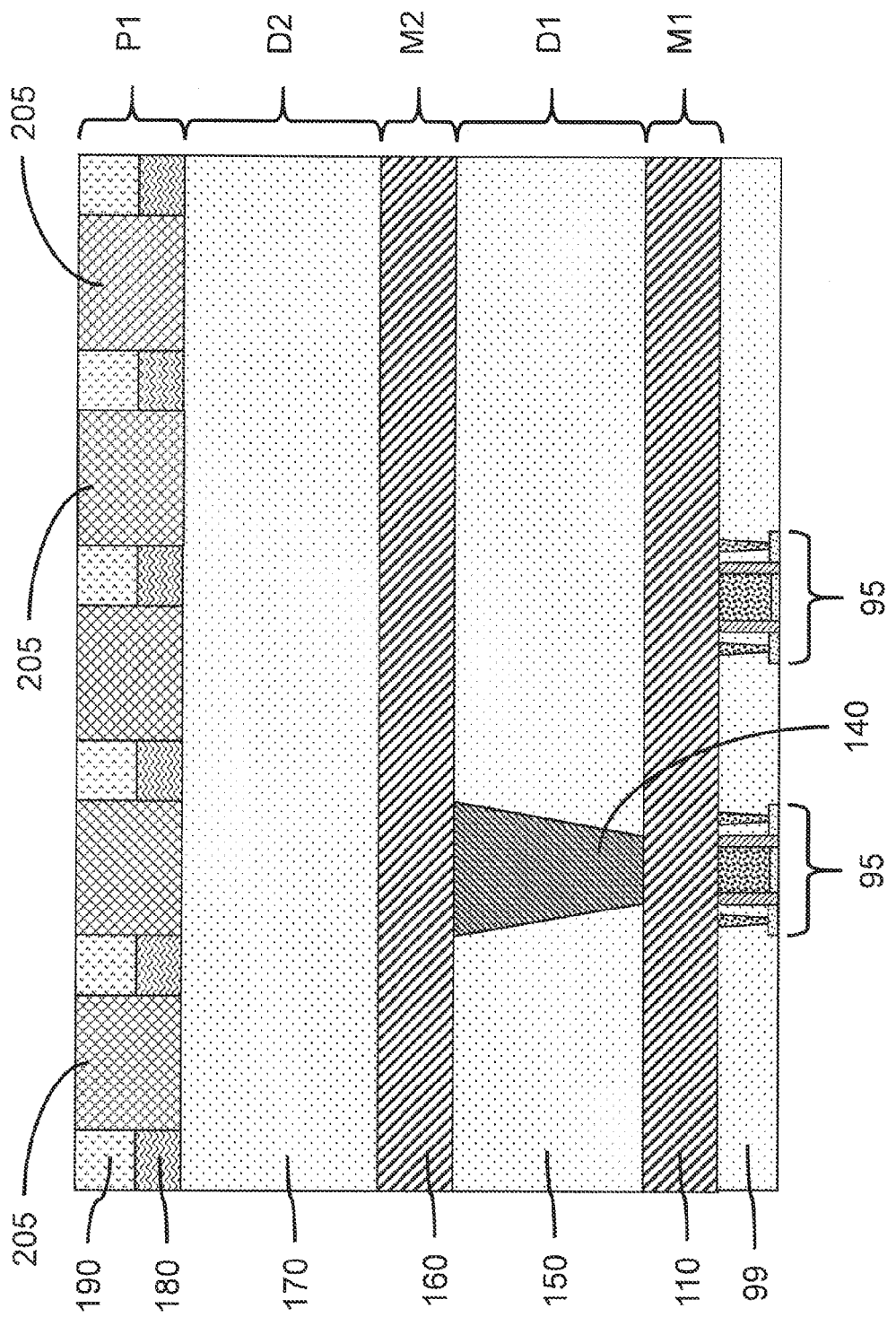
FIG. 2 is a cross-sectional side view of a first metallization layer, M1, an intervening dielectric layer, D1, a second metallization layer, M2, a second dielectric layer, D2, and filled openings in the patterning layer formed on the second dielectric layer, in accordance with an embodiment of the present invention.

FIG. 2 is a cross-sectional side view of a first metallization layer, M1, an intervening dielectric layer, D2, a second metallization layer, M2, a second dielectric layer, D2, and filled openings in the patterning layer formed on the second dielectric layer, in accordance with an embodiment of the present invention.

In one or more embodiments, a masking layer can be formed on the cover layer 190, where the masking layer can be an photoresist layer, as would be known in the art. The photoresist layer can be patterned and developed to expose one or more sections of the cover layer 190, as would be known in the art.

In one or more embodiments, the exposed portions of the underlying cover layer 190 can be removed using a selective directional etch, for example, a reactive ion etch (RIE). Removal of the portions of the underlying cover layer 190 can form openings that expose the underlying hardmask layer 180. A second RIE can be used to remove the exposed portions of the hardmask layer 180 to deepen the openings down to the surface of the second dielectric layer 170.

In one or more embodiments, a fill layer can be formed on the photoresist layer or the cover layer 190 if the photoresist layer was previously removed, for example, by stripping or ashing. The fill layer can fill in the openings formed in the cover layer 190 and hardmask layer 180, where the fill layer can extend above the surface of the cover layer 190. If the fill layer is formed on the photoresist layer, the excess fill layer material can be removed by a lift-off process, as would be known in the art. If the fill layer is formed on the cover layer 190, a chemical-mechanical polishing can be used to remove the fill layer extending above the top surface of the cover layer 190. Removal of the excess fill layer material above the top surface of the cover layer 190 can form a fill layer plug 205 in each opening formed in the cover layer 190 and hardmask layer 180.

In one or more embodiments, the fill layer and fill layer plugs 205 can be silicon carbide (SiC), an organic planarization layer (e.g., polyacrylate resin, epoxy resin, etc.), or other materials that can be selectively removed from cover layer 190 and/or the second dielectric layer, D2, where for example, a selective etch rate ratio can be 10 to 1.

Figure 3:
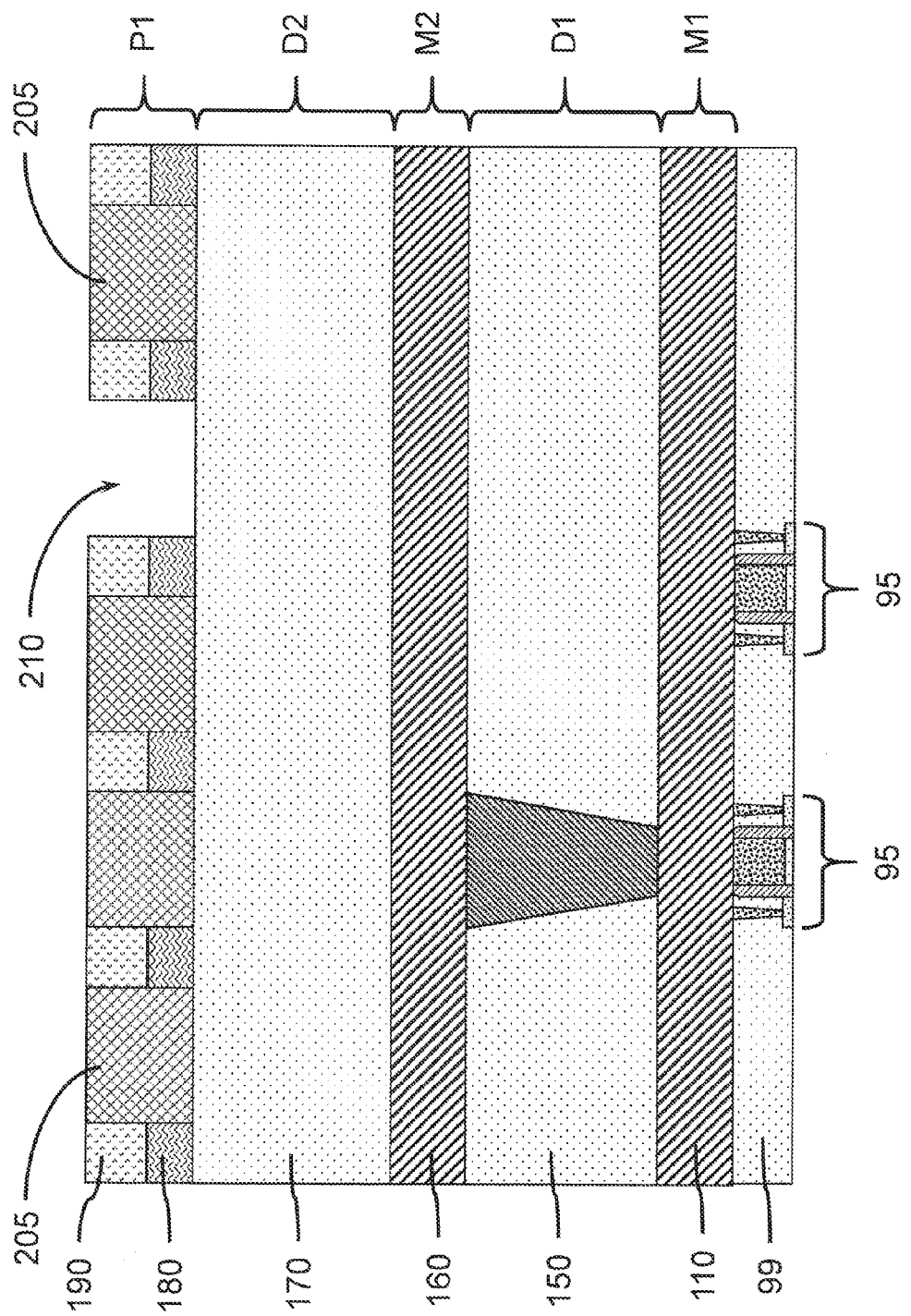
FIG. 3 is a cross-sectional side view showing an opening in the patterning layer, P1, in accordance with an embodiment of the present invention.

FIG. 3 is a cross-sectional side view showing an opening in the patterning layer, P1, in accordance with an embodiment of the present invention.

In one or more embodiments, one or more of the fill layer plugs 205 formed in the patterning layer, P1, may be removed to reform the opening 210 in the patterning layer, P1. The fill layer plug(s) 205 can be removed by forming a masking layer on the fill layer plug(s) 205, cover layer 190 and hardmask layer 180, and patterning the masking layer to expose the one or more fill layer plugs 205 to be removed. A selective dry or wet etch can be used to remove the exposed fill layer plugs 205. Removal of the fill layer plug(s) can expose one or more sections of the underlying second dielectric layer, D2, 170.

Figure 4:
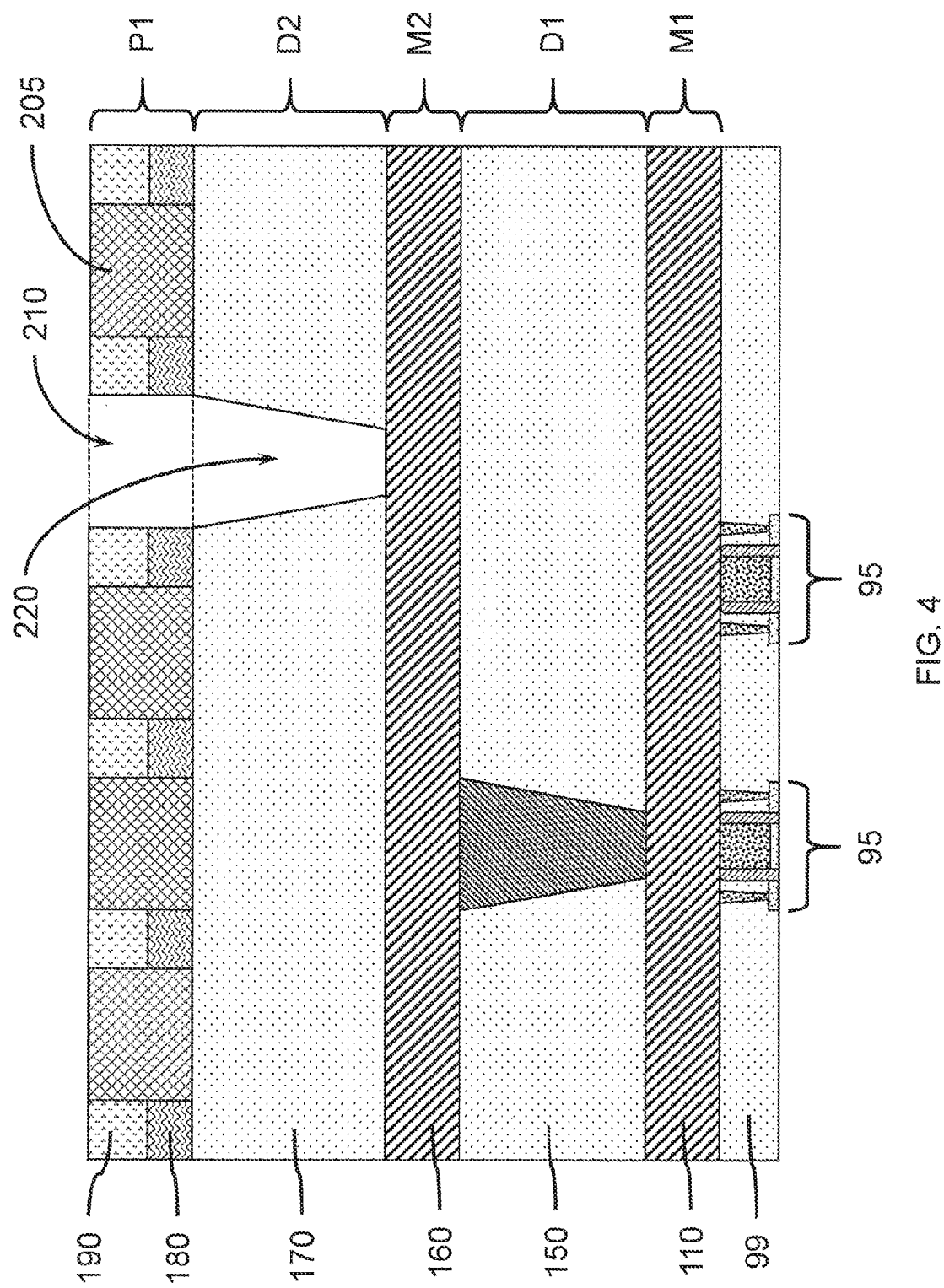
FIG. 4 is a cross-sectional side view showing a via formed in the second dielectric layer, D2, in accordance with an embodiment of the present invention.

FIG. 4 is a cross-sectional side view showing a via formed in the second dielectric layer, D2, in accordance with an embodiment of the present invention.

In one or more embodiments, the exposed section(s) of the second dielectric layer 170 can be removed to extend the opening 210 and form a via 220 to the second metallization layer, M2, 160 through the second dielectric layer 170. The exposed section(s) of the second dielectric layer 170 can be removed using a selective directional etch, (e.g., a selective RIE).

In one or more embodiments, the via 220 formed by removing the second dielectric layer 170 can form part of a skip-via, where the via 220 is extended passed the second metallization layer, M2, 160, without forming an electrical connection to the second metallization layer.

In one or more embodiments, formation of one or more via(s) 220 through the second dielectric layer 170 can expose portions of the second metallization layer 160. The second metallization layer 160 can act as an etch stop, where the via 220 intersects with and exposes a metal layer, for example, a channel.

Figure 5:
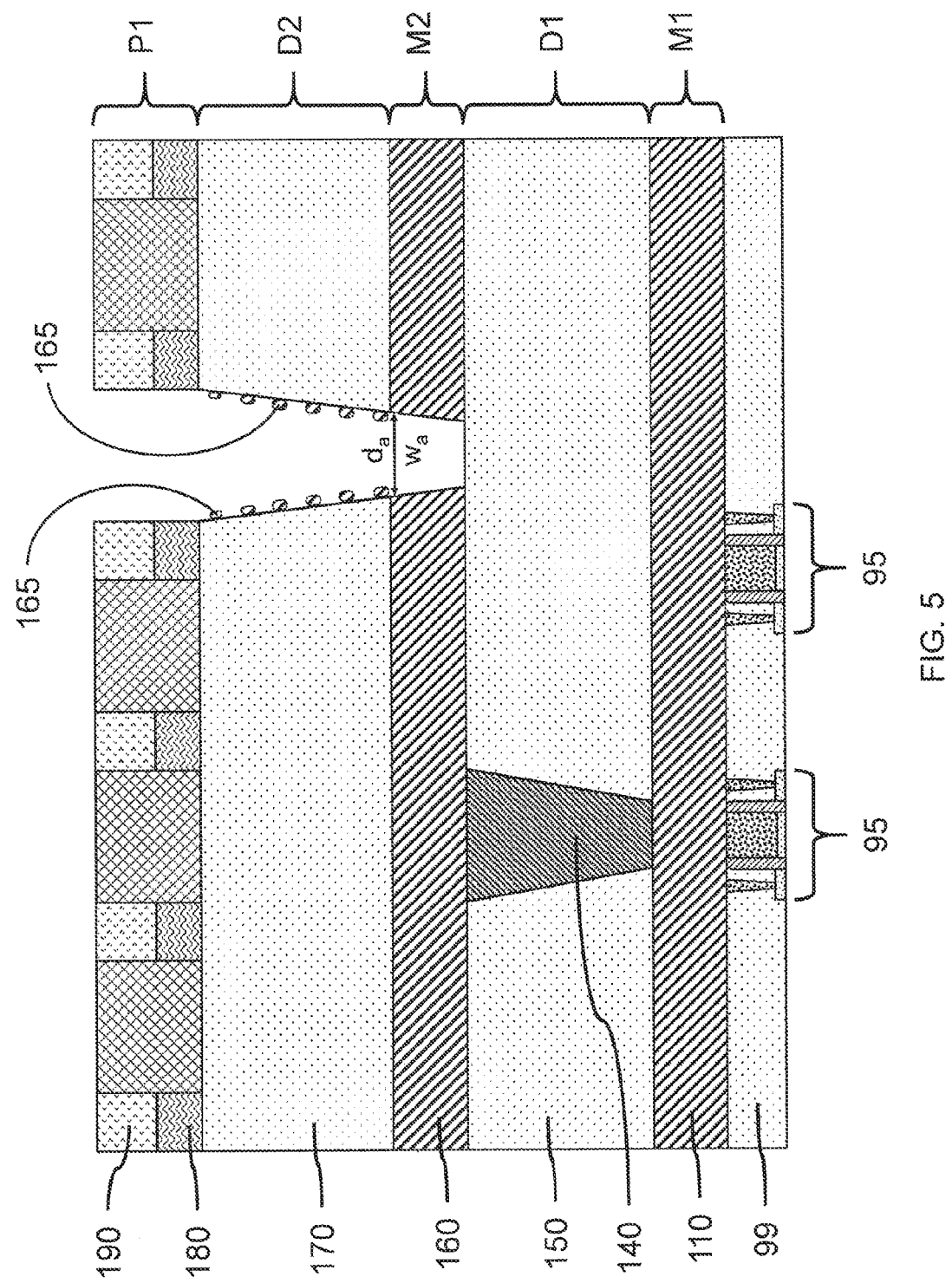
FIG. 5 is a cross-sectional side view showing the via extending through the second metallization layer to the first dielectric layer, in accordance with an embodiment of the present invention.

FIG. 5 is a cross-sectional side view showing the via extending through the second metallization layer to the first dielectric layer, in accordance with an embodiment of the present invention.

In one or more embodiments, the metal layer of the second metallization layer 160 exposed by the via 220 can be removed, where the metal is removed using a separate removal process. In various embodiments, an ion beam etching (IBE) technique can be used to remove the exposed metal, for example, copper or tungsten, forming at least a portion of the second metallization layer 160. The ion beam etching (IBE) can provide a directional, non-selective etching of the metal through a sputtering process. The ablated material from the ion sputtering of the second metallization layer 160 may redeposit on the sidewalls of the via 220 to form residual deposits 165.

In one or more embodiments, the via 220 can be extended through the second metallization layer 160, where the first dielectric layer, D1, 150 can act as an etch stop. Formation of the via through the metal layer of the second metallization layer, M2, 160 can produce an aperture at the interface of the second metallization layer 160 with the second dielectric layer 170 having a diameter, $d_a$, if the via is circular or width, $w_a$, if the via is rectangular or square, although other shapes are also contemplated for the via (e.g., oval, elliptical, quadrilateral, pentagonal, etc.). The aperture can be larger than the base of the via 220 due to aspects of the removal process, where the via 220 has sloping sidewalls.

In one or more embodiments, the diameter, $d_a$, or width, $w_a$, of the aperture can be in the range of about 12 nm to about 20 nm, or in the range of about 15 nm to about 17 nm, although other aperture sizes are also contemplated.

The via 220 can be laterally displaced from the D2 level via 140, such that the via 220 does not intersect with the D2 level via 140 when the via 220 passes through the second metallization layer 160.

Figure 6:
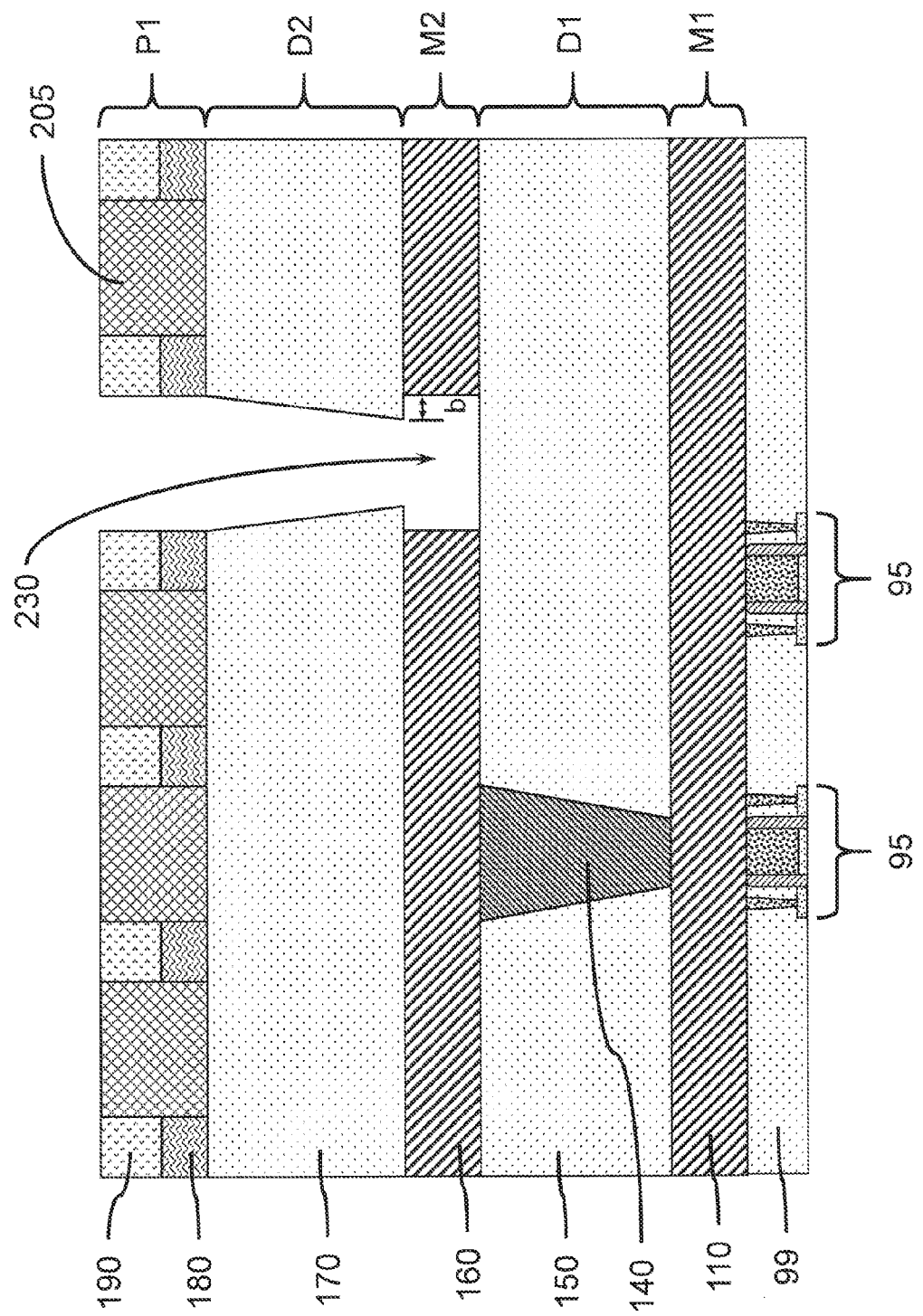
FIG. 6 is a cross-sectional side view showing an exclusion zone formed in the second metallization layer after formation of the via, in accordance with an embodiment of the present invention.

FIG. 6 is a cross-sectional side view showing an exclusion zone formed in the second metallization layer after formation of the via, in accordance with an embodiment of the present invention.

An exclusion zones typically is where designers cannot place transistors, and in some cases, back-end-of-the-line wiring as well, within a metallization layer. In one or more embodiments, this exclusion zone would be an area where designers cannot place wiring at the second metallization layer, M2.

In one or more embodiments, the diameter, $d_a$, or width, $w_a$, of the aperture can be increased laterally within the second metallization layer 160 by selectively removing a portion of the metal layer through which the via 220 passes. A self-aligned exclusion zone 230 can be formed within the second metallization layer, M2, by selectively widening the via 220, where the via is widened by a lateral distance, b, relative to the diameter, $d_a$, or width, $w_a$, of the aperture. The self-aligned exclusion zone 230 extends through the metal layer of the second metallization layer 160 to the top surface of the first dielectric layer 150, where the exclusion zone 230 can be self-aligned with the via.

In various embodiments, the self-aligned exclusion zone 230 can be formed using a selective, isotropic etch to remove the metal from the sidewalls of the via 220, where the selective etch can also remove the residual deposits 165 from the sidewalls of the second dielectric layer 170 exposed by the via 220. The selective isotropic etch can be a wet etch that is introduced into via 220. The etch can be a timed etch to control the lateral distance, b, generated by the etching process, where the isotropic etch undercuts a portion of the second dielectric layer 170.

In one or more embodiments, In one or more embodiments the lateral distance, b, can be in the range of about 5 nm to about 12 nm, or in the range of 5 nm to about 7 nm, or 5 nm to 6 nm. In various embodiments, the self-aligned exclusion zone 230 for the via 220 through the second metallization layer can be two times the lateral distance, b, plus the diameter, $d_a$, or width, $w_a$, of the aperture. The self-aligned exclusion zone 230 can have a width, $W_{Ex}$, or diameter, $D_{Ex}$, in the range of about 25 nm to about 39 nm, or about 25 nm to about 25 nm to about 29 nm, or 25 nm to 27 nm, where the width, $W_{Ex}$, of the self-aligned exclusion zone 230 is less than the width of a non-self-aligned exclusion zone.

The exclusion zone 230 is self-aligned to the via 220, since the same opening 210 is used to form the via 220, and the lateral distance, b, is in reference to the via. The width of the self-aligned exclusion zone 230 can be controlled by controlling the lateral distance, b, and the diameter, $d_a$, or width, $w_a$, of the aperture to achieve the required tolerances.

Figure 7:
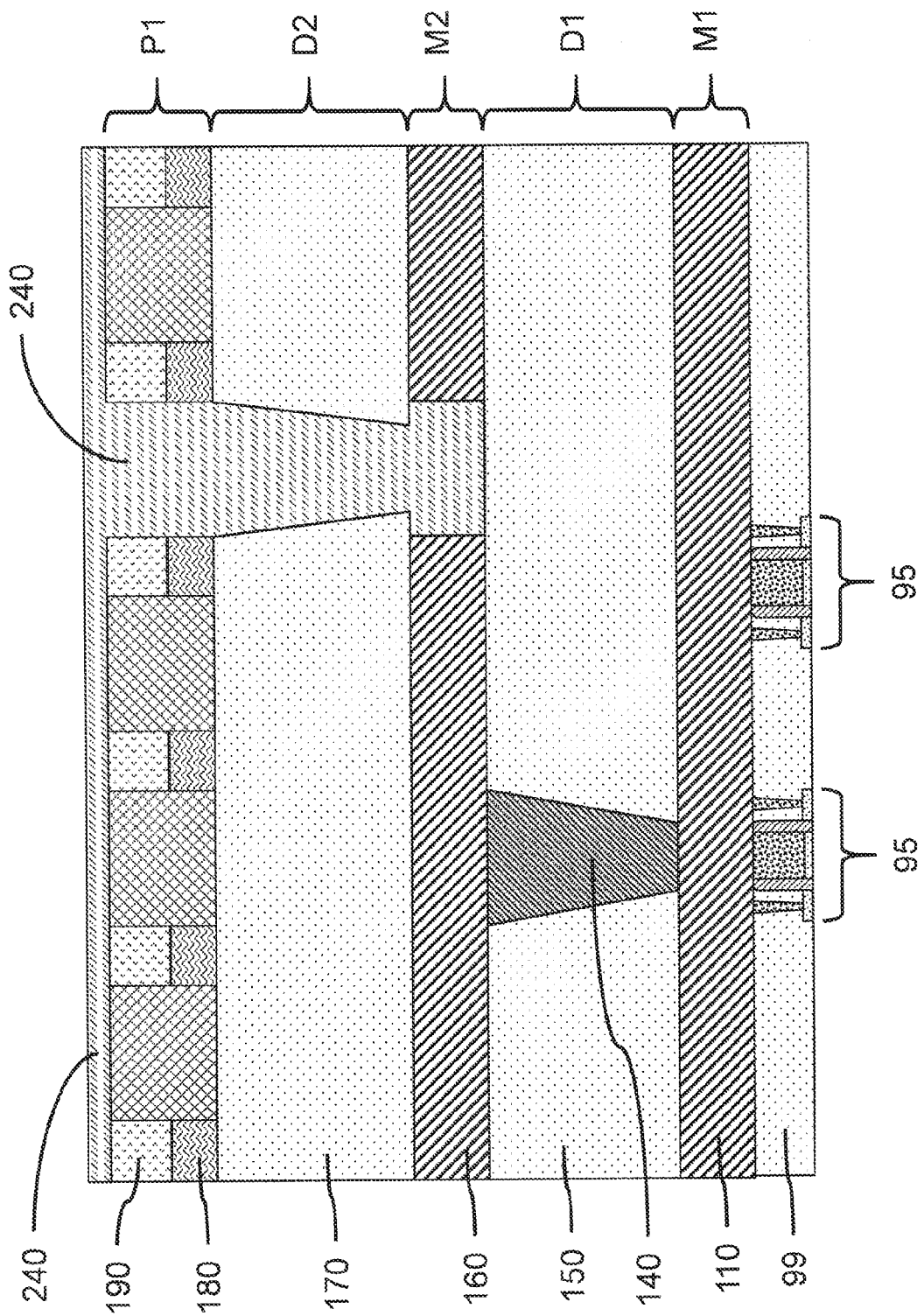
FIG. 7 is a cross-sectional side view of a dielectric fill formed in the via and exclusion zone, in accordance with an embodiment of the present invention.

FIG. 7 is a cross-sectional side view of a dielectric fill formed in the via and exclusion zone, in accordance with an embodiment of the present invention.

In one or more embodiments, a dielectric fill 240 can be formed in the via 220 and self-aligned exclusion zone 230, where the dielectric fill 240 can be formed by a conformal deposition, for example, ALD or PEALD, to cover the portions of exclusion zone that undercut the second dielectric layer 170 without formation of gaps or voids in the dielectric fill 240.

In one or more embodiments, a dielectric fill 240 can be formed in the via 220 and exclusion zone 230, where the dielectric fill 240 can be formed by a gas phase deposition or flowable process, for example LPCVD formation using tetraethyl orthosilicate (TEOS) and silane ($SiH_4$), where the gas-phase precursors can deposit on the undercut surfaces to fill the self-aligned exclusion zone 230. The dielectric fill 240 may also form on the top surfaces of the cover layer 190 and fill layer plug 205.

In various embodiments, the dielectric fill 240 can be a silicon oxide (SiO), silicon nitride (SiN), silicon oxynitride (SiON), a low-K dielectric, or a combination thereof. In various embodiments, the low-k dielectric can include, but is not limited to, a fluoride-doped silicon oxide (e.g., fluoride doped glass), a carbon-doped silicon oxide, a porous silicon oxide, a spin-on silicon based polymeric material (e.g., tetraethyl orthosilicate (TEOS), hydrogen silsesquioxane (HSQ) and methylsilsesquioxane (MSQ)), or combinations thereof. A low-k insulator material can have a dielectric constant of less than 3.9. The dielectric fill 240 can also passivate the exposed surfaces of the metal layer of the second metallization layer, M2, 160.

Figure 8:
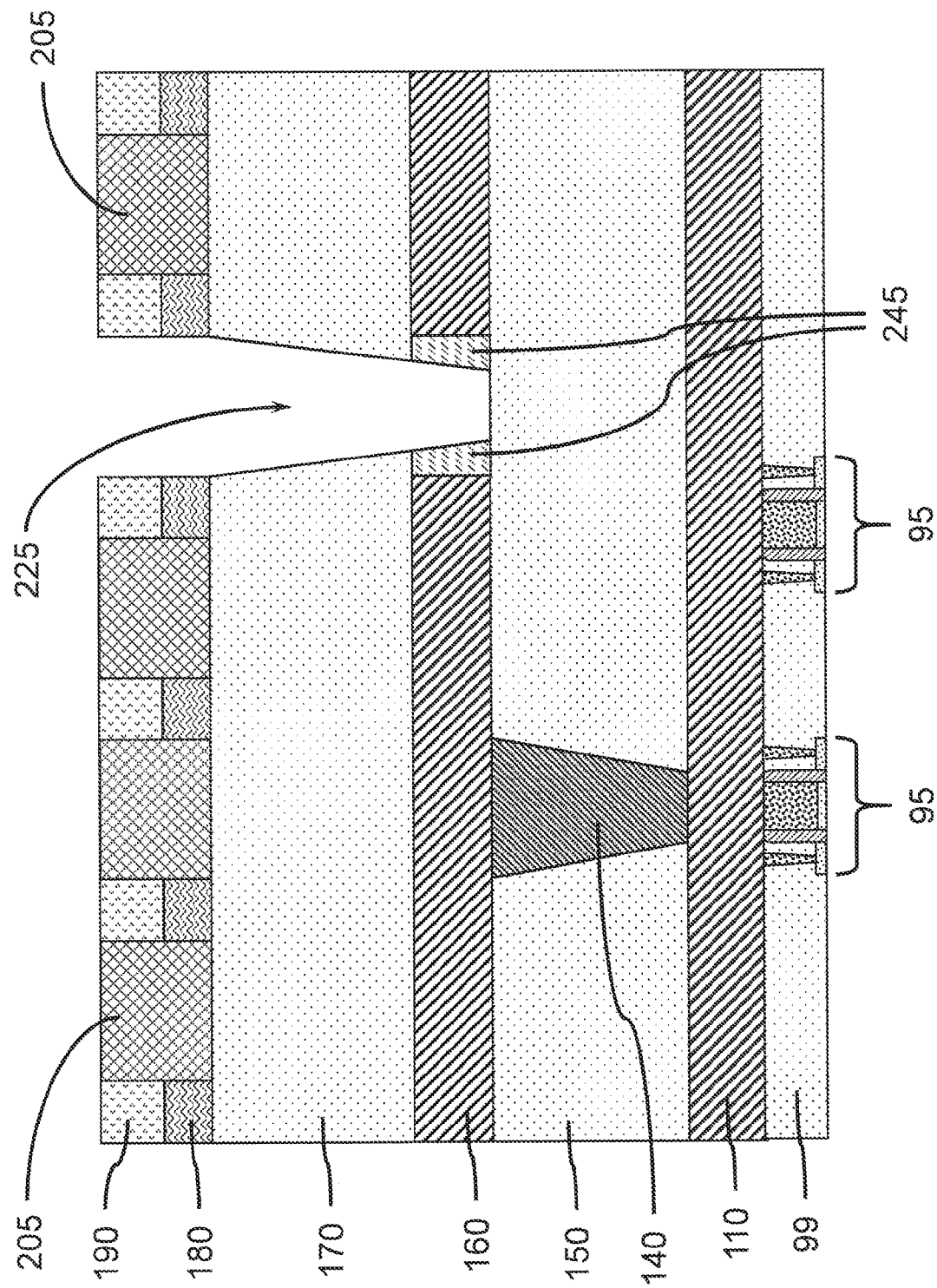
FIG. 8 is a cross-sectional side view showing a dielectric collar around the reformed via in the exclusion zone, in accordance with an embodiment of the present invention.

FIG. 8 is a cross-sectional side view showing a dielectric collar around the reformed via in the exclusion zone, in accordance with an embodiment of the present invention.

In one or more embodiments, a portion of the dielectric fill 240 can be removed to leave a dielectric collar 245 around a reformed via 225 in the second dielectric layer 170 and second metallization layer 160. In various embodiments, a portion of the dielectric fill 240 can be removed by a directional etch (e.g., RIE) to expose the surface of the first dielectric layer 150. Removal of the portion of the dielectric fill 240 can leave the portion of the dielectric fill 240 in the undercut region of the second metallization layer shadowed by the second dielectric layer 170 as a dielectric collar 245.

In one or more embodiments, the dielectric collar 245 can be an annular or rectangular wall separating the metal of the second metallization layer 160 from a metal interconnect formed in the reformed via 225, where the dielectric collar 245 can insulate the second metallization layer from a metal interconnect. The dielectric collar 245 can have a width, $W_{dc}$, or diameter, $D_{dc}$, in the range of about 25 nm to about 39 nm, or about 25 nm to about 29 nm, or 25 nm to 27 nm, where the dielectric collar 245 fills the exclusion zone.

The dielectric collar 245 can be a silicon oxide (SiO), silicon nitride (SiN), silicon oxynitride (SiON), a low-K dielectric, or a combination thereof. In various embodiments, the low-k dielectric can include, but is not limited to, a fluoride-doped silicon oxide (e.g., fluoride doped glass), a carbon-doped silicon oxide, a porous silicon oxide, a spin-on silicon based polymeric material (e.g., tetraethyl orthosilicate (TEOS), hydrogen silsesquioxane (HSQ) and methylsilsesquioxane (MSQ)), or combinations thereof.

In various embodiments, the dielectric fill 240 is removed from the via 220 and from the surfaces of the cover layer 190 and fill layer plug 205. The portion of the dielectric fill 240 can be removed from the cover layer 190 and fill layer plug 205, for example, by an RIE or a CMP before reforming the via.

Figure 9:
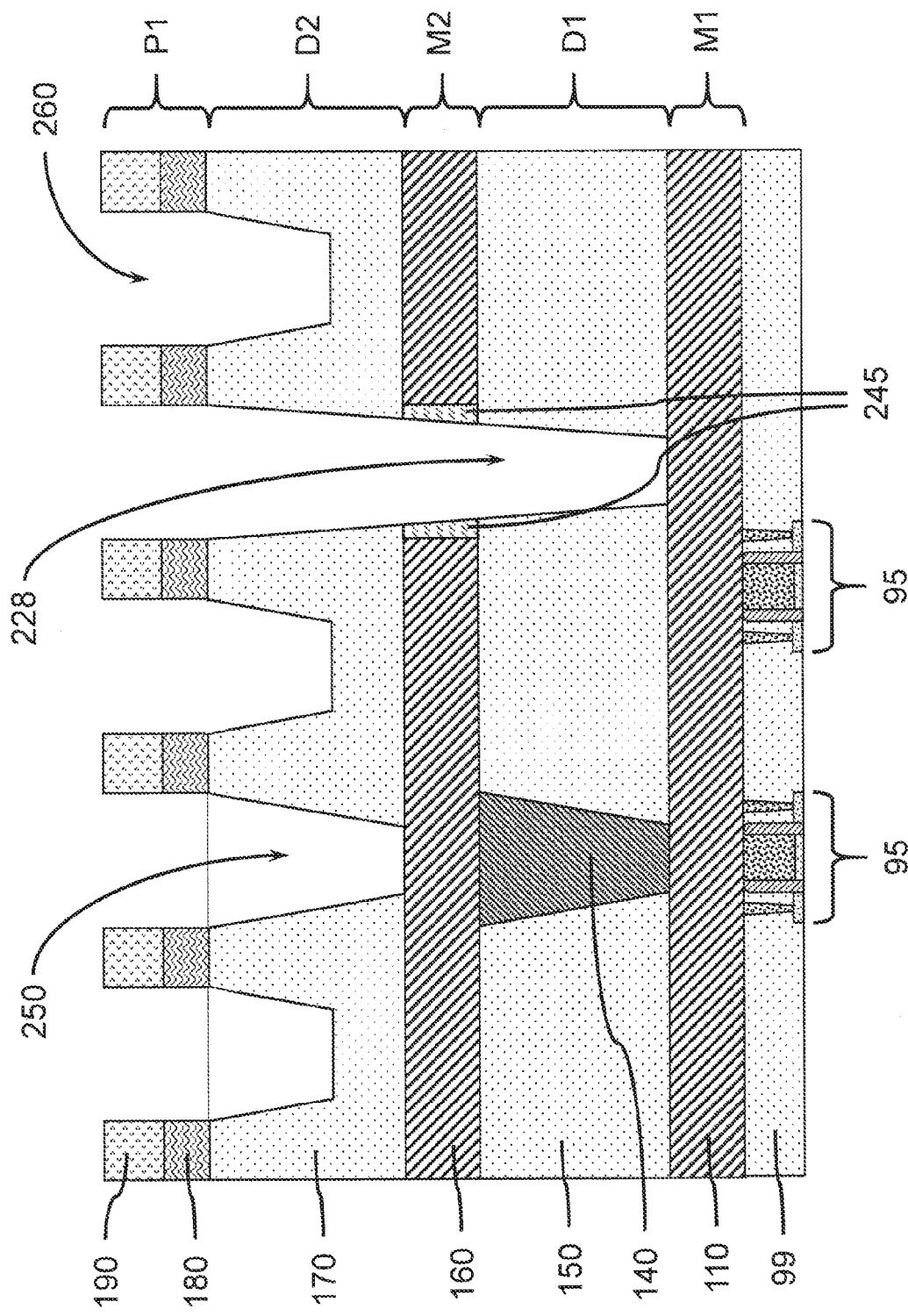
FIG. 9 is a cross-sectional side view showing the reformed via extending through the first dielectric layer to the first metallization layer to form a skip-via, in accordance with an embodiment of the present invention.

FIG. 9 is a cross-sectional side view showing the reformed via extending through the first dielectric layer to the first metallization layer to form a skip-via, in accordance with an embodiment of the present invention.

In one or more embodiments, the reformed via 225 can be extended through the first dielectric layer 150 to the first metallization layer 110 to form a skip-via 228 that passes through the second metallization layer 160, while remaining electrically isolated from the second metallization layer 160. The first metallization layer 110 underlies the second metallization layer 160. The skip-via 228 can interconnect a subsequently formed third metallization layer with the first metallization layer 110, where the third metallization layer can overlie the second metallization layer 160.

In one or more embodiments, the skip-via 228 can be formed by a directional etch (e.g., RIE), where the etch can be selective for the material of the first dielectric layer 150 to avoid over-etching the dielectric collar 245.

In one or more embodiments, the fill layer plug(s) 205 can be removed to expose other sections of the underlying second dielectric layer 170, where the fill layer plug(s) 205 can be removed by a selective wet or dry etch (e.g., perfluorocyclobutane ($C_4F_8$) RIE). The exposed portions of the underlying second dielectric layer 170 can then be removed to form vias 250 to the second metallization layer 160, as well as other intermediate contacts 260.

Figure 10:
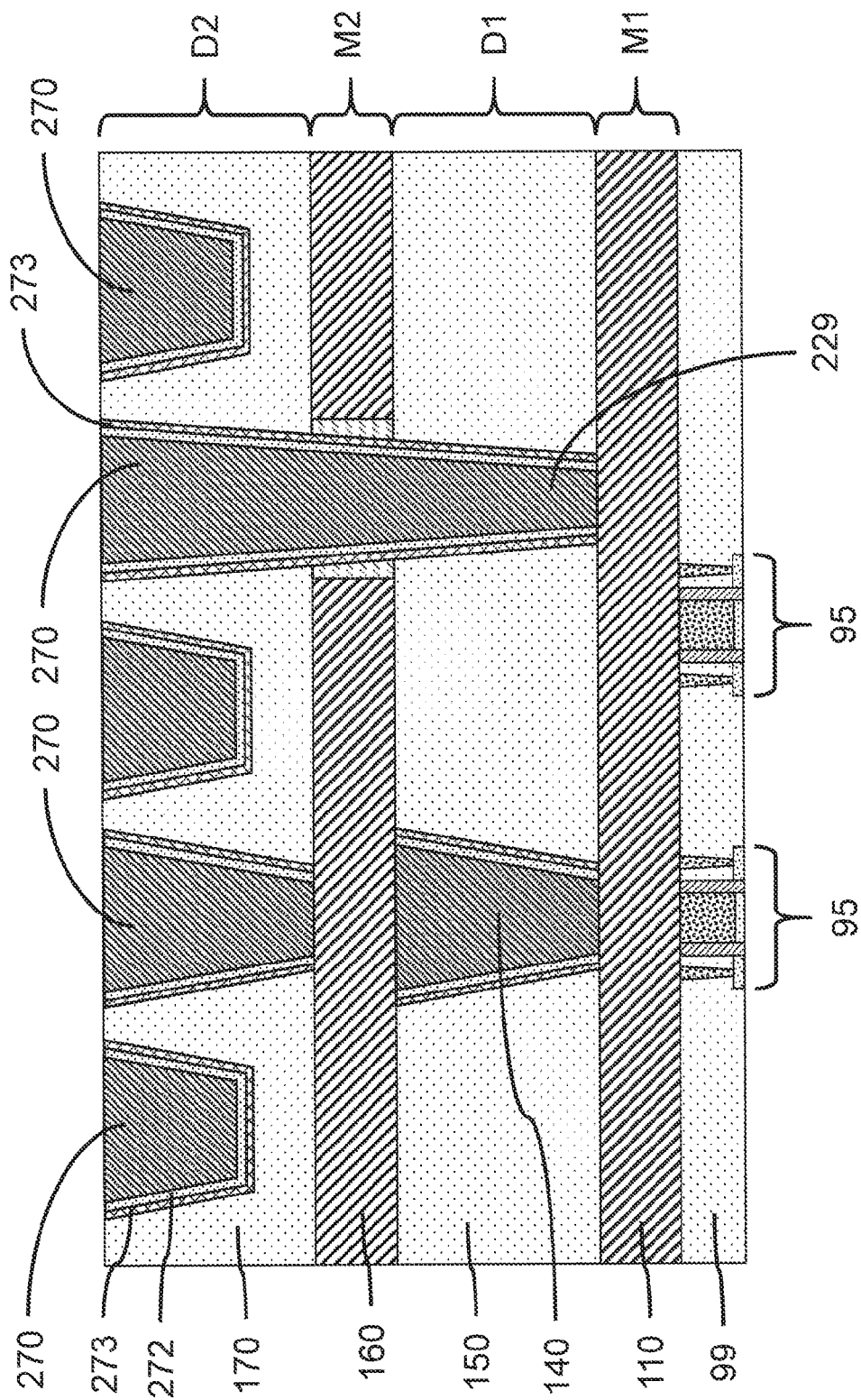
FIG. 10 is a cross-sectional side view showing the skip-via and other vias filled with a conductive material, in accordance with an embodiment of the present invention.

FIG. 10 is a cross-sectional side view showing the skip-via and other vias filled with a conductive material, in accordance with an embodiment of the present invention.

In one or more embodiments, a conductive material fill 270 can be formed in the skip-via 228, as well as the other vias 250 and intermediate contacts 260. The conductive material fill 270 can be formed by conformally depositing a seed layer 272 on the exposed sidewalls of the skip-via 228, other vias 250, and intermediate contacts 260, for example, by ALD or PEALD, and then depositing a bulk layer on the seed layer. A bulk layer can be formed on the seed layer, for example, by CVD, PECVD, electrodeposition, or combinations thereof. In various embodiments, a barrier layer 273 can be formed on the sidewalls of the skip-via 228, other vias 250, and intermediate contacts 260, to prevent diffusion of a metal into the dielectric layers, before forming a seed layer 272. In various embodiments, a liner layer may be formed on the barrier layer 273 before forming the seed layer 272, for example, to reduce or avoid electro-migration of a metal conductive material fill.

In one or more embodiments, the barrier layer 273 can be titanium (Ti), tantalum (Ta), titanium nitride (TiN), tantalum nitride (TaN), ruthenium (Ru), cobalt (Co) or any suitable combinations thereof. In various embodiments, the seed layer 272 can include copper (Cu), cobalt (Co), tungsten (W) or any suitable combinations thereof.

In one or more embodiments, the conductive material fill can be a conductive metal, where the metal can be tungsten (W), titanium (Ti), molybdenum (Mo), cobalt (Co), or a conductive carbon material (e.g., carbon nanotube, graphene, etc.), or any suitable combinations thereof.

In one or more embodiments, formation of a conductive material fill in the skip-via 228 can form a skip-via contact 229, where the skip-via contact can electrically connect the first metallization layer to a higher level metallization layer, while bypassing intervening metallization layers (e.g., M2).

In one or more embodiments, the cover layer 190 and the hardmask layer 180 can be removed from the second dielectric layer 170 before formation of the metal fill 270.

In one or more embodiments, a back-end-of-line interconnect structure including a layer stack can be formed on a substrate including one or more semiconductor devices and/or one or more passive devices. The back-end-of-line interconnect structure can include a first metallization layer, M1, a first dielectric layer, D1, a second metallization layer, M2, and a second dielectric layer, D2, where a conductive material filled via can electrically interconnect two different metallization layers through at least one of the dielectric layer(s). The first dielectric layer can be formed on the first metallization layer. The second metallization layer can be formed on the first dielectric layer and a second dielectric layer can be formed on the second metallization layer. Additional layers including metallization layers and dielectric layer can be formed on the second dielectric layer, D2, where, for example, a third metallization layer can be formed on the second dielectric layer, D2. There can be ten or more metallization layers in the layer stack of the back-end-of-line interconnect structure.

In various embodiments, a skip-via contact 229 can interconnect a third metallization layer with the first metallization layer, M1, without forming an electrical connect to the second metallization layer, M2. The dielectric collar 245 formed in the second metallization layer 160 around the skip-via contact 229 can provide an exclusion zone, where conductive channels and wiring are not formed in the second metallization layer.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It should be understood that use of descriptions such as top, bottom, left, right, vertical, horizontal, or the like, are intended to be in reference to the orientation(s) illustrated in the figures, and are intended to be descriptive and to distinguish aspects of depicted features without being limiting. Spatially relative terms, such as "beneath," "below," "lower," "above," "upper," and the like, may be used herein for ease of description to describe one element's or feature's relationship to another element(s) or feature(s) as illustrated in the FIGs. It will be understood that the spatially relative terms are intended to encompass different orientations of the device in use or operation in addition to the orientation depicted in the FIGs. For example, if the device in the FIGs. is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein may be interpreted accordingly. In addition, it will also be understood that when a layer is referred to as being "between" two layers, it can be the only layer between the two layers, or one or more intervening layers may also be present.

It will be understood that, although the terms first, second, etc. may be used herein to describe various elements, these elements should not be limited by these terms. These terms are only used to distinguish one element from another element. Reference to first, second, third, etc., feature is intended to distinguish features without necessarily implying a particular order unless otherwise so stated or indicated. Thus, a first element discussed herein could be termed a second element without departing from the scope of the present concept.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Having described preferred embodiments of a device and fabrication method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A back-end-of-line interconnect structure having a skip-via, comprising:
   a first metallization layer on a substrate;
   a first dielectric layer on the first metallization layer;
   a second metallization layer on the first dielectric layer;
   a second dielectric layer on the second metallization layer;
   the skip-via extending through the second dielectric layer, second metallization layer, and first dielectric layer to the first metallization layer; and
   an insulating, dielectric collar in the second metallization layer around the skip-via to form an exclusion zone, wherein the dielectric collar has a width, $W_{dc}$, or diameter, $D_{dc}$, in the range of about 25 nm to about 39 nm.

2. The back-end-of-line interconnect structure of claim 1, wherein the dielectric collar is an annular or rectangular wall separating a metal of the second metallization layer from the skip-via.

3. The back-end-of-line interconnect structure of claim 1, wherein the substrate includes one or more semiconductor devices.

4. The back-end-of-line interconnect structure of claim 1, further comprising one or more additional vias.

5. The back-end-of-line interconnect structure of claim 1, wherein the dielectric collar is silicon oxide (SiO), silicon nitride (SiN), silicon oxynitride (SiON), a low-K dielectric, or a combination thereof.

6. A skip-via that passes through a metallization layer, comprising:

a via that extends through the metallization layer, wherein the via has sloping sidewalls;

a dielectric collar around the via in the metallization layer; and a conductive material fill in the via.

7. The skip-via of claim 6, wherein the dielectric collar is an annular or rectangular wall separating a metal of the metallization layer from the skip-via.

8. The skip-via of claim 7, wherein the dielectric collar has a width, $W_{dc}$, or diameter, $D_{dc}$, in the range of about 25 nm to about 29 nm.

9. The skip-via of claim 7, wherein the dielectric collar is silicon oxide (SiO), silicon nitride (SiN), silicon oxynitride (SiON), a low-K dielectric, or a combination thereof.

10. The skip-via of claim 9, wherein the dielectric collar fills an exclusion zone in the metallization layer.

11. The skip-via of claim 6, further comprising a barrier layer on sidewalls of the skip-via.

12. The skip-via of claim 11, wherein the barrier layer is titanium (Ti), tantalum (Ta), titanium nitride (TiN), tantalum nitride (TaN), ruthenium (Ru), cobalt (Co) or any suitable combinations thereof.

13. The skip-via of claim 11, further comprising a seed layer on the barrier layer.

14. The skip-via of claim 13, wherein the seed layer includes copper (Cu), cobalt (Co), tungsten (W) or a suitable combination thereof.

15. A back-end-of-line interconnect structure having a self-aligned exclusion zone, comprising:

a first metallization layer on a substrate, wherein the substrate includes one or more semiconductor devices;

a first dielectric layer on the first metallization layer;

a second metallization layer on the first dielectric layer;

a second dielectric layer on the second metallization layer;

a skip-via extending through the second dielectric layer, second metallization layer, and first dielectric layer to the first metallization layer, where the skip via forms an aperture at the interface of the second metallization layer with the second dielectric layer, where the aperture has a diameter, $d_a$, if the via is circular or width, $w_a$, if the via is rectangular or square; and the exclusion zone extending a lateral distance from the aperture of the skip-via, wherein the lateral distance, b, is in the range of about 5 nm to about 12 nm.

16. The back-end-of-line interconnect structure, of claim 15, wherein the aperture has a diameter, $d_a$, or width, $w_a$, in the range of about 12 nm to about 20 nm.

17. The back-end-of-line interconnect structure, of claim 16, wherein the lateral distance, b, is in the range of 5 nm to about 7 nm.

18. The back-end-of-line interconnect structure, of claim 16, wherein a dielectric collar fills the exclusion zone.

19. The back-end-of-line interconnect structure, of claim 18, wherein the dielectric collar is an annular or rectangular wall separating a metal of the metallization layer from the skip-via.

\* \* \* \* \*